United States Patent
Schultz

(10) Patent No.: US 10,796,061 B1
(45) Date of Patent: Oct. 6, 2020

(54) STANDARD CELL AND POWER GRID ARCHITECTURES WITH EUV LITHOGRAPHY

(71) Applicant: Advanced Micro Devices, Inc., Santa Clara, CA (US)

(72) Inventor: Richard T. Schultz, Fort Collins, CO (US)

(73) Assignee: Advanced Micro Devices, Inc., Santa Clara, CA (US)

(*) Notice: Subject to any disclaimer, the term of this patent is extended or adjusted under 35 U.S.C. 154(b) by 0 days.

(21) Appl. No.: 16/555,865

(22) Filed: Aug. 29, 2019

(51) Int. Cl.
 G06F 30/394 (2020.01)
 H01L 27/02 (2006.01)
 G06F 30/392 (2020.01)

(52) U.S. Cl.
 CPC ......... *G06F 30/394* (2020.01); *G06F 30/392* (2020.01); *H01L 27/0207* (2013.01)

(58) Field of Classification Search
 CPC ... G06F 30/394; G06F 30/392; H01L 27/0207
 USPC ....................................................... 716/120
 See application file for complete search history.

(56) References Cited

U.S. PATENT DOCUMENTS

| | | | |
|---|---|---|---|
| 4,851,892 A | 7/1989 | Anderson et al. | |
| 5,889,329 A | 3/1999 | Rostoker et al. | |
| 6,100,101 A | 8/2000 | Marathe et al. | |
| 6,242,767 B1 | 6/2001 | How et al. | |
| 6,609,242 B1 | 8/2003 | Slade | |
| 7,064,074 B2 | 6/2006 | Van Bentum et al. | |
| 8,264,007 B2 | 9/2012 | Becker et al. | |
| 8,356,268 B2 | 1/2013 | Becker et al. | |
| 8,561,003 B2 | 10/2013 | Kawa et al. | |
| 8,680,626 B2 | 3/2014 | Smayling et al. | |
| 9,400,862 B2 | 7/2016 | Kawa et al. | |
| 9,431,383 B2 | 8/2016 | Baek et al. | |
| 9,460,259 B2 | 10/2016 | Baek et al. | |
| 9,502,351 B1 | 11/2016 | Sahu | |

(Continued)

FOREIGN PATENT DOCUMENTS

WO  WO2007073599 A1  7/2007

OTHER PUBLICATIONS

Xie et al., "5nm FinFET Standard Cell Library Optimization and Circuit Synthesis in Near- and Super-Threshold Voltage Regimes", 2014 IEEE Computer Society Annual Symposium on VLSI, Jul. 2014, pp. 424-429.

(Continued)

*Primary Examiner* — Suresh Memula
(74) *Attorney, Agent, or Firm* — Kowert Hood Munyon Rankin and Goetzel PC; Rory D. Rankin

(57) ABSTRACT

A system and method for creating chip layout are described. In various embodiments, a standard cell uses unidirectional tracks for power connections and signal routing. At least two tracks of the metal one layer using a minimum width of the metal one layer are placed within a pitch of a single metal gate to provide a standard cell with a two to one "gear ratio" or greater. A power signal and a ground reference signal in the metal one layer are routed in a same metal one track to provide area for other signal routing. Multiple standard cells are placed in a multi-cell layout with routes in one or more of the metal two layer and the metal three layer using minimum lengths for power connections. The layout includes no power grid with a fixed pitch.

20 Claims, 8 Drawing Sheets

(56) References Cited

U.S. PATENT DOCUMENTS

| | | | |
|---|---|---|---|
| 9,553,028 B2 | 1/2017 | Xie et al. | |
| 9,589,847 B1 | 3/2017 | Chi et al. | |
| 9,633,987 B2 | 4/2017 | Smayling et al. | |
| 9,659,939 B1 | 5/2017 | Cao et al. | |
| 9,691,768 B2 | 6/2017 | Moroz et al. | |
| 9,704,995 B1 | 7/2017 | Schultz | |
| 9,837,398 B1* | 12/2017 | Rowhani | H01L 27/0207 |
| 9,837,437 B2 | 12/2017 | Baek et al. | |
| 10,438,937 B1 | 10/2019 | Schultz | |
| 2003/0023937 A1 | 1/2003 | Mcmanus et al. | |
| 2005/0212562 A1 | 9/2005 | Gliese et al. | |
| 2007/0063244 A1 | 3/2007 | Ho et al. | |
| 2007/0157144 A1 | 7/2007 | Mai et al. | |
| 2007/0278528 A1 | 12/2007 | Ato et al. | |
| 2007/0284619 A1 | 12/2007 | Kanno et al. | |
| 2008/0283925 A1 | 11/2008 | Berthold et al. | |
| 2009/0187871 A1 | 7/2009 | Cork | |
| 2010/0127333 A1 | 5/2010 | Hou et al. | |
| 2010/0287518 A1 | 5/2010 | Becker | |
| 2010/0148219 A1 | 6/2010 | Shimizu | |
| 2013/0026572 A1 | 1/2013 | Kawa et al. | |
| 2013/0087834 A1 | 4/2013 | Park et al. | |
| 2013/0146986 A1 | 6/2013 | Rashed et al. | |
| 2013/0154128 A1 | 6/2013 | Wang et al. | |
| 2013/0155753 A1 | 6/2013 | Moon et al. | |
| 2013/0295756 A1 | 11/2013 | Yuan et al. | |
| 2013/0313513 A1 | 11/2013 | Cappellani et al. | |
| 2013/0334613 A1 | 12/2013 | Moroz | |
| 2014/0145342 A1 | 5/2014 | Schultz et al. | |
| 2014/0252650 A1 | 9/2014 | Utsumi et al. | |
| 2014/0264742 A1 | 9/2014 | Yen et al. | |
| 2015/0048425 A1 | 2/2015 | Park et al. | |
| 2015/0052494 A1 | 2/2015 | Tarabbia et al. | |
| 2015/0069531 A1 | 3/2015 | Naczas et al. | |
| 2015/0269302 A1 | 9/2015 | Katta et al. | |
| 2015/0302917 A1 | 10/2015 | Grover et al. | |
| 2016/0163644 A1 | 6/2016 | Woo et al. | |
| 2016/0276287 A1 | 9/2016 | Iwabuchi | |
| 2016/0284705 A1 | 9/2016 | Chung | |
| 2017/0011999 A1 | 1/2017 | Heo | |
| 2017/0125292 A1 | 5/2017 | Greene et al. | |
| 2017/0154848 A1 | 6/2017 | Fan et al. | |
| 2017/0263506 A1 | 9/2017 | Bouche et al. | |
| 2017/0294448 A1 | 10/2017 | Debacker et al. | |
| 2017/0323902 A1* | 11/2017 | Zeng | H01L 23/485 |
| 2017/0365621 A1 | 12/2017 | Becker et al. | |
| 2017/0371995 A1 | 12/2017 | Correale, Jr. et al. | |
| 2017/0373090 A1 | 12/2017 | Correale, Jr. et al. | |
| 2018/0033701 A1 | 2/2018 | Bouche et al. | |
| 2018/0040631 A1* | 2/2018 | Kim | H01L 29/785 |
| 2018/0090440 A1* | 3/2018 | Schultz | H01L 23/5286 |
| 2018/0183414 A1 | 6/2018 | Guo et al. | |
| 2018/0190670 A1* | 7/2018 | Ryckaert | H01L 29/7827 |
| 2018/0314785 A1* | 11/2018 | Schultz | H01L 27/11807 |
| 2018/0315709 A1* | 11/2018 | Schultz | H01L 29/4966 |
| 2019/0065650 A1 | 2/2019 | Pelloie | |
| 2019/0155979 A1* | 5/2019 | Schultz | G06F 30/39 |
| 2019/0363167 A1* | 11/2019 | Schultz | H01L 21/76895 |
| 2019/0385999 A1* | 12/2019 | Berzins | G06F 30/398 |

OTHER PUBLICATIONS

Cui et al., "7nm FinFET Standard Cell Layout Characterization and Power Density Prediction in Near- and Super-Threshold Voltage Regimes", International Green Computing Conference, Nov. 2014, 7 pages.

International Search Report and Written Opinion in International Application No. PCT/US2018/029767, dated Jul. 11, 2018, 14 pages.

International Search Report and Written Opinion in International Application No. PCT/US2018/029760, dated Jul. 16, 2018, 16 pages.

Non-Final Office Action in U.S. Appl. No. 15/636,245, dated May 18, 2018, 30 pages.

Final Office Action in U.S. Appl. No. 15/636,245, dated Jan. 14, 2019, 31 pages.

Non-Final Office Action in U.S. Appl. No. 15/636,245, dated May 29, 2019, 23 pages.

Non-Final Office Action in U.S. Appl. No. 15/636,278, dated Apr. 5, 2019, 12 pages.

International Search Report and Written Opinion in International Application No. PCT/US2017/052775, dated Mar. 26, 2018, 17 pages.

International Search Report and Written Opinion in International Application No. PCT/US2018/052369, dated Jan. 7, 2019, 16 pages.

Non-Final Office Action in U.S. Appl. No. 15/275,028, dated Sep. 28, 2018, 10 pages.

Non-Final Office Action in U.S. Appl. No. 15/819,879, dated Mar. 18, 2019, 10 pages.

Final Office Action in U.S. Appl. No. 15/275,028, dated May 16, 2019, 12 pages.

\* cited by examiner

STANDARD CELL AND POWER GRID ARCHITECTURES WITH EUV LITHOGRAPHY

BACKGROUND

Description of the Relevant Art

As both semiconductor manufacturing processes advance and on-die geometric dimensions reduce, semiconductor chips provide more functionality and performance while consuming less space. While many advances have been made, design issues still arise with modern techniques in processing and integrated circuit design that limit potential benefits. For example, capacitive coupling, electromigration, leakage currents and processing yield are some issues which affect the placement of devices and the routing of signals across an entire die of a semiconductor chip. Thus, these issues have the potential to delay completion of the design and affect the time to market.

In order to shorten the design cycle for semiconductor chips, manual full-custom designs are replaced with automation where possible. A designer provides a description of a functional unit or a complex gate in a high-level description language such as Verilog, VHDL and so on. A synthesis tool receives the logic description and provides the logical netlist. The logical netlist is used by a place-and-route (PNR) tool to provide physical layout. The place-and-route tool uses a cell layout library to provide the physical layout.

The cell layout library includes multiple standard cell layouts for providing the various functionalities used by the semiconductor chip. In some cases, a standard cell layout is created manually. Therefore, each new standard cell layout or each original standard cell layout being modified is created manually. In other cases, the rules used by the place-and-route tool are adjusted to automate the cell creation. However, the automated process at times does not satisfy each of the rules directed at performance, power consumption, signal integrity, process yield, both local and external signal routing including internal cross coupled connections, height and width cell dimensions matching other cells, pin access, power rail design and so on. Therefore, designers manually create these cells to achieve better results for the multiple characteristics or rewrite the rules for the place-and-route tool.

Generally, the standard cell layouts use at least one power rail for the supply voltage connections also referred to as the VDD power rail and one power rail for the ground connections also referred to as the VSS power rail. In some cases, the power and ground rails use relatively long wires utilizing multiple metal layers such as horizontal metal zero, vertical metal one, horizontal metal two and vertical metal three in addition to the corresponding vias. In other cases, fixed location posts are used within the standard cell to make the power and ground connections. Each of these cases reduces flexibility for placement of the standard cell in the semiconductor chip and for alleviating signal routing congestion. Real-time routing optimization is limited or completely removed.

In view of the above, efficient methods and systems for creating layout for a chip are desired.

BRIEF DESCRIPTION OF THE DRAWINGS

The advantages of the methods and mechanisms described herein may be better understood by referring to the following description in conjunction with the accompanying drawings, in which.

Figure 1:
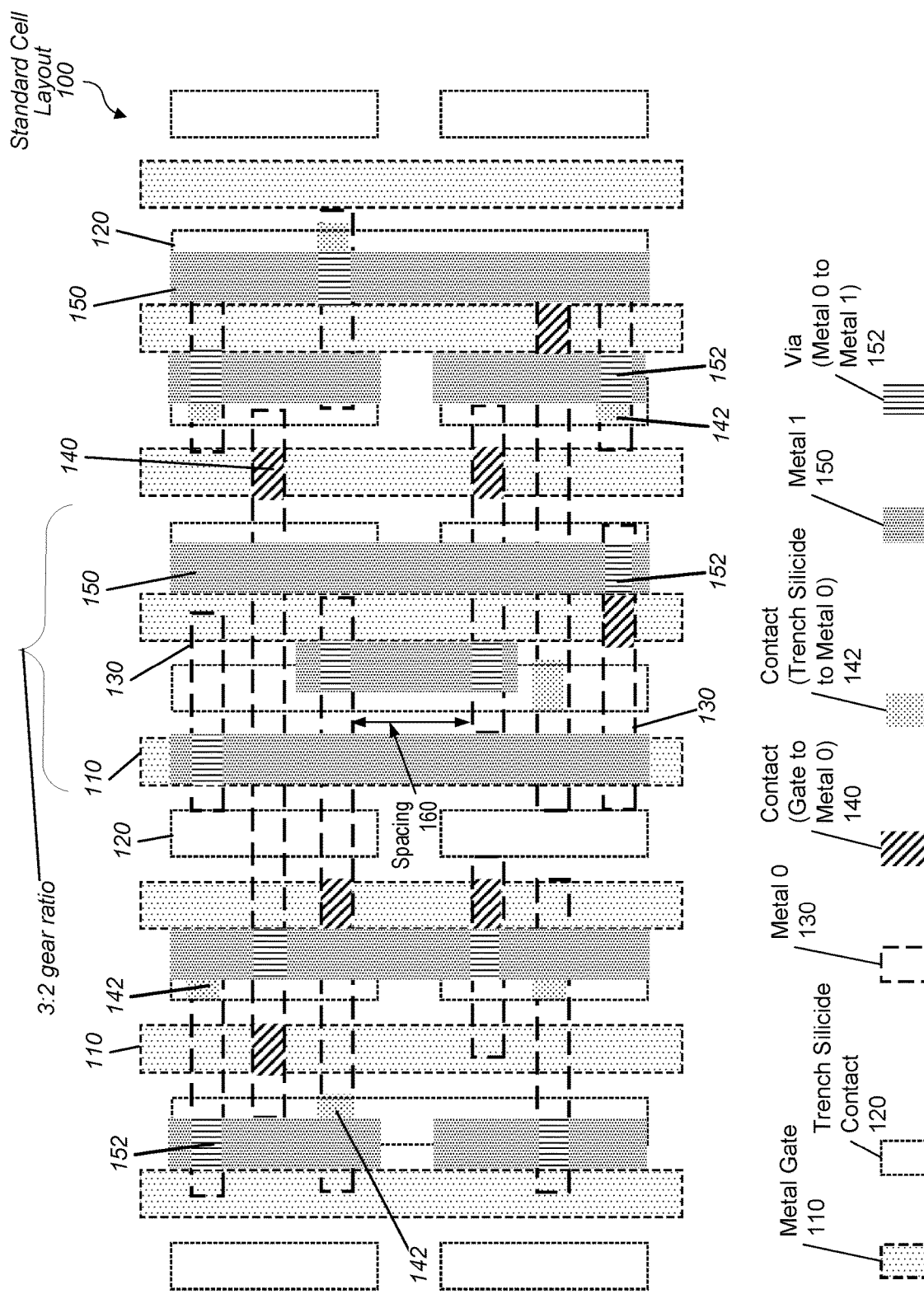
FIG. 1 is a generalized diagram of a top view of a standard cell layout for a complex logic gate.

While the invention is susceptible to various modifications and alternative forms, specific embodiments are shown by way of example in the drawings and are herein described in detail. It should be understood, however, that drawings and detailed description thereto are not intended to limit the invention to the particular form disclosed, but on the contrary, the invention is to cover all modifications, equivalents and alternatives falling within the scope of the present invention as defined by the appended claims.

DETAILED DESCRIPTION

In the following description, numerous specific details are set forth to provide a thorough understanding of the methods and mechanisms presented herein. However, one having ordinary skill in the art should recognize that the various embodiments may be practiced without these specific details. In some instances, well-known structures, components, signals, computer program instructions, and techniques have not been shown in detail to avoid obscuring the approaches described herein. It will be appreciated that for simplicity and clarity of illustration, elements shown in the figures have not necessarily been drawn to scale. For example, the dimensions of some of the elements may be exaggerated relative to other elements.

Systems and methods for laying out power grid connections for standard cells are contemplated. In various embodiments, a standard cell includes unidirectional tracks for routing signals in one or more metal layers. In some embodiments, at least two tracks of the metal one layer uses a minimum width of the metal one layer and are placed within a pitch of a single metal gate. For the standard cell, a maximum ratio of a first number of tracks of a metal one layer that can fit in an area with a minimum width for the metal one layer to a second number of tracks of a metal gate layer that can fit in the same area with a minimum width for the metal gate layer and still provide a processing yield above a threshold is referred to as the "gear ratio". Each of the first number and the second number is a positive, non-zero integer. In previous designs, the gear ratio was three to two, or the standard cells are capable of including three tracks of the metal one layer in an area that also includes two tracks of metal gate. With advanced development of semiconductor fabrication lithography techniques, the gear ratio increases such as from three to two (3:2) to two to one (2:1) or greater.

One or more signals of the standard cell in the metal one layer are routed using a minimum length for the metal one layer as defined by design rules. The minimum length provides signal pins, such as input, output and intermediate signals, to a chip level place-and-route tool while still satisfying the minimum area requirements for the metal one layer. The minimum length reduces electromigration effects and provides area for signal routing for neighboring cells. A custom cell designer or an automated synthesis tool routes, in a same metal one track, a power signal in the metal one layer and a ground reference signal in the metal one layer. Locating each of the power signal and the ground reference signal in a same track of the metal one layer provides area for signal routing for the standard cell and later for neighboring cells when chip level signal routing is performed.

One or more of a custom cell designer and an automated synthesis tool places multiple standard cells in a multi-cell layout. Multiple standard cells of varying type are used to create an array at the chip level. In various embodiments, the multi-cell layout includes one or more routes in a metal two layer using a minimum length for the metal two layer as defined by design rules. In an embodiment, both signal routes and power routes in the metal two layer at the chip level use a maximum length as defined by a Blech length for the metal two layer. The Blech length limits the lengths of routes based on current density and reduces electromigration failures of the routes. Therefore, the multi-cell layout does not use rails in the metal two layer for power routes.

In various embodiments, the resulting array is not connected to a power grid using a particular pitch. For example, there is no power grid pitch used for determining where to place posts of any metal layer for creating power and ground reference connections. Similar to the routes in the metal two layer, in some embodiments, one or more signals are also routed in a metal three layer in the multi-cell layout using a minimum length for the metal three layer as defined by design rules. In an embodiment, both signal routes and power routes in the metal three layer at the chip level use a maximum length as defined by a Blech length for the metal three layer. After routing one or more signals for creating power and ground reference connections at the chip level, the place-and-route tool identifies any signal congestion at the chip level. In an embodiment, the place-and-route tool identifies metal three posts (and corresponding vias for connecting metal three to metal four) to remove for creating area for relieving signal congestion. In addition, the place-and-route tool lengthens a corresponding metal two route to connect a metal one post to a nearby other metal three post for a ground or power connection. In some embodiments, the place-and-route tool performs these changes only for areas where the lengthened route in the metal two layer does not exceed the Blech length for the metal two layer. In some embodiments, the place-and-route tool also identifies areas at the chip level for adding or relocating signal routes to increase via redundancy. Increasing via redundancy increases the processing yield for the chip.

Referring to FIG. 1, a generalized block diagram of a top view of a standard cell layout 100 is shown. Here, the active regions are not shown in the standard cell layout 100 for ease of illustration. The p-type metal oxide semiconductor (PMOS) field effect transistors FETS (or pfets) are at the top of the standard cell layout 100. The n-type metal oxide semiconductor (NMOS) FETS (or nfets) are at the bottom of the standard cell layout 100. In the illustrated embodiment, the standard cell layout 100 is for a complex logic gate. In an embodiment, the standard cell layout 100 is for a two-to-one (2:1) multiplexer. However, in other embodiments, the characteristics and techniques used for standard cell layout 100 is used for a variety of other types of complex gates.

In various embodiments, the devices (or transistors) in the standard cell layout 100 are non-planar devices. Non-planar transistors are used in semiconductor processing for reducing short channel effects. Tri-gate transistors, Fin field effect transistors (FETs) and gate all around (GAA) transistors are examples of non-planar transistors. As shown, the standard cell layout 100 uses metal gate 110 in a vertical direction, trench silicide contacts 120 for the source and drain regions in the vertical direction, metal 0 (M0 or Metal0) 130 for local interconnections in the horizontal direction, contacts 140 for connecting the metal gate 110 to Metal1) 130 and contacts 142 for connecting the trench silicide contact 120 to Metal1) 130. The layout 100 uses a triplet group at the top for routing three horizontal signal routes with the horizontal Metal1) 130 local interconnect. In addition, the layout 100 uses a triplet group at the bottom for routing three horizontal signal routes with the horizontal Metal1) 130 local interconnect. In some embodiments, a spacing 160 exists between the two triplet groups, which can be used for additional signal routing tracks. In an embodiment, the spacing 160 is a minimum pitch between two tracks in Metal1) 130. In such embodiments, no additional signal routing tracks are placed between the two triplet groups, but the height of the layout 100 reduces.

The standard cell layout 100 additionally uses metal 1 (M1 or Metal1) 150 for local interconnections in the vertical direction and vias 152 for connecting the horizontal interconnect Metal1) 130 to the vertical interconnect Metal1 150. Layout 100 uses power pins at the top and the ground pins at the bottom. As shown, layout 100 does not use rails anywhere in Metal1) 130. The vertical Metal1 150 routing at the top provides flexible connection to horizontal metal 2 (M2 or Metal2, which is not shown) for creating power connections. The vertical Metal1 150 routing at the bottom provides flexible connection to Metal2 tracks (not shown for ease of illustration) for creating ground connections.

In some embodiments, the devices in the standard cell layout 100 are fabricated by one of the immersion lithography techniques, the double patterning technique, the extreme ultraviolet lithography (EUV) technique, and the directed self-assembly (DSA) lithography technique. In some embodiments, the EUV technique provides more flexibility relative to via and contact modules relative to other techniques. In some embodiments, the extreme ultraviolet lithography (EUV) technique is used to provide the resolution of each of the width and the pitch of the layout such as the horizontal Metal1) 130 routes in the triplet groups. The EUV technique uses an extreme ultraviolet wavelength to reach resolution below 40 nanometers. The extreme ultraviolet wavelength is approximately 13.5 nanometers. Relatively high temperature and high density plasma is used to provide the EUV beam. In other embodiments, the directed self-assembly (DSA) lithography technique used to provide the resolution of each of the width and the pitch. The DSA technique takes advantage of the self-assembling properties of materials to reach nanoscale dimensions.

In other embodiments, the resolution of each of the width and the pitch of the layout layers in the standard cell layout 100 is set by the immersion lithography technique. Immersion lithography uses a liquid medium, such as purified water, between the lens of the imaging equipment and the wafer surface. Previously, the gap space was simply air. The resolution achieved by this technique is the resolution of the imaging equipment increased by the refractive index of the liquid medium. In some examples, the increased resolution falls above 80 nanometers.

In yet other embodiments, the double patterning technique is used to provide the resolution of each of the width and the pitch of the layout layers in the standard cell layout 100. The double patterning technique uses immersion lithography systems to define features with resolution between 40 and 80 nanometers. Either of the self-aligned doubled patterning (SADP) technique or the litho-etch-litho-etch (LELE) technique is used. The double patterning technique counteracts the effects of diffraction in optical lithography, which occurs when the minimum dimensions of features on a wafer are less than the 193 nanometer wavelength of the illuminating light source. Other examples of techniques used to counteract the effects of diffraction in optical lithography are phase-shift masks, optical-proximity correction (OPC) techniques, optical equipment improvements and computational lithography.

When selecting between immersion lithography, double patterning, EUV and DSA techniques, and other techniques, cost is considered as the cost increases from immersion lithography to EUV. However, over time, the costs of these techniques adjust as well as additional and newer techniques are developed for providing relatively high resolution for the width and the pitch of the horizontal Metal1) 130 routes in the triplet groups. Accordingly, one of a variety of lithography techniques is used to provide relatively high resolution for the width and the pitch.

Although one of a variety of lithography techniques provides relatively high resolution for the width and the pitch of the layout layers in the standard cell layout 100, achieving a processing yield above a threshold for the metal gate 110 is more difficult than for Metal1 150. Accordingly, for the standard cell layout 100, the maximum ratio of a number of vertical Metal1 150 tracks to a number of vertical metal gate 110 tracks is greater than one. For the standard cell, this maximum ratio of a first number of Metal1 150 tracks that can fit in an area with a minimum width for Metal1 150 tracks to a second number of metal gate 110 tracks that can fit in the area with a minimum width for metal gate 110 tracks and still provide a processing yield above a threshold is referred to as the "gear ratio". Each of the first number and the second number is a positive, non-zero integer. In previous designs, the gear ratio was three to two or less such as one to one. However, with advanced development of lithography techniques, the gear ratio increases such as from three to two (3:2) to two to one (2:1) or greater.

In the illustrated embodiment, the standard cell layout 100 has a three to two (3:2) gear ratio. For example, beginning from the left of the layout 100, the area for the fourth and fifth metal gate 110 tracks also includes the third, fourth and fifth Metal1 150 tracks.

The resolution of the width and pitch of the Metal1 150 tracks is capable of becoming finer as semiconductor fabrication processes continue to develop. However, as the width and pitch of the metal gate 110 tracks become finer, the resistance of the devices (transistors) increases, which reduces the performance of the devices. In addition, as the width and pitch of the metal gate 110 tracks become finer, the width of the trench silicide contacts 120 between the metal gate 110 tracks needs to reduce, which also increases the resistance of the devices between the source/drain regions and the gate of the devices. So even if the fabrication process is capable of reducing the width and pitch of the metal gate 110 tracks, the resulting performance of the devices creates a limit on the reduction.

For the layouts of these previous designs, many of the standard cells have two layouts in the layout library due to be able to place standard cells next to one other and follow layout rules such as snapping (aligning) to the defined metal one grid for Metal1 150 tracks. In addition, the layouts of these previous designs included placing the Boolean 2-input NAND gate, the 2-input NOR gate and the inverter at the chip level in order to connect to metal zero of neighboring cells. Other design issues arise for the layouts of these previous designs that are not encountered for a standard cell layout 100 with a gear ratio of two or greater.

Figure 2:
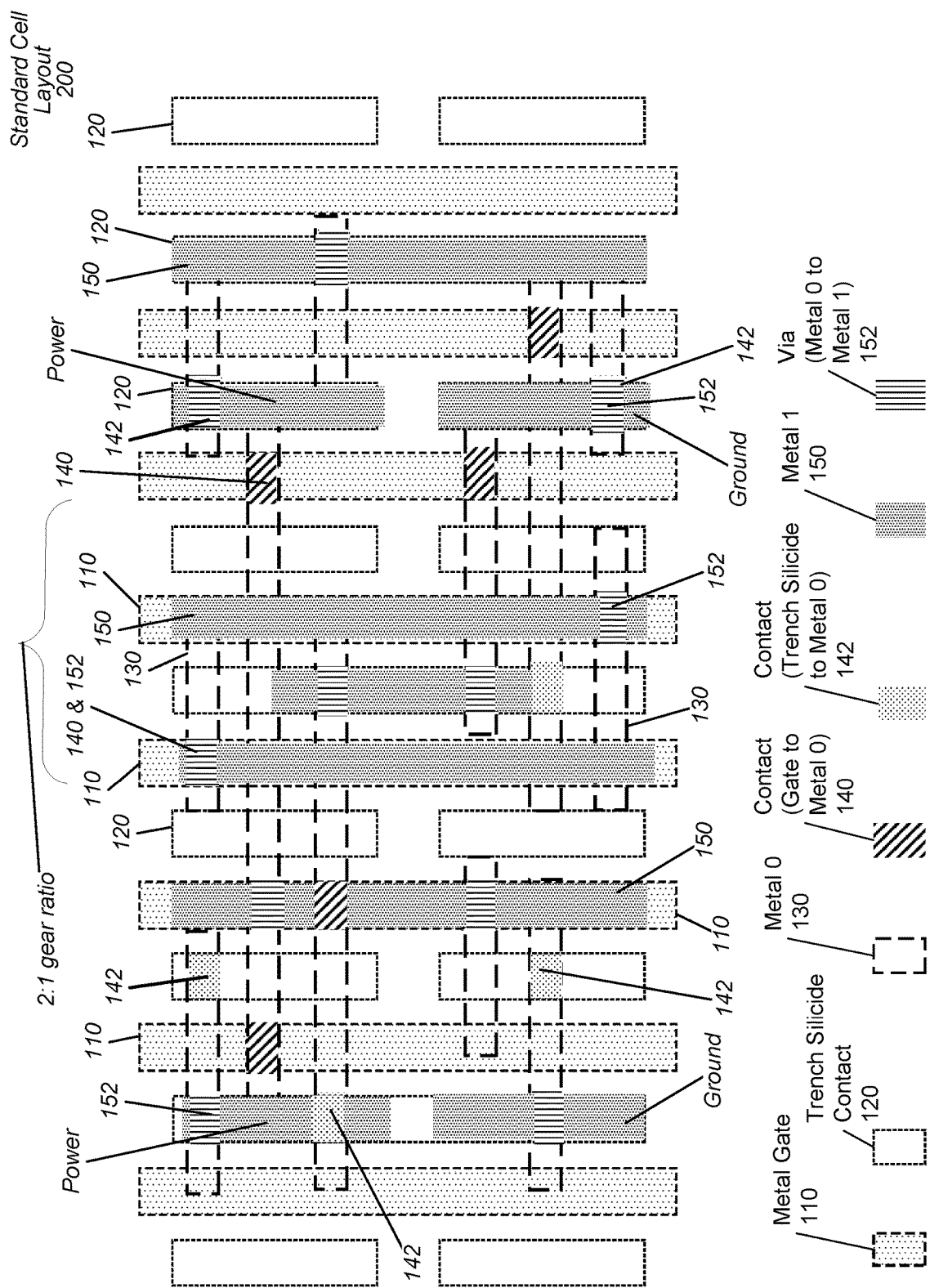
FIG. 2 is a generalized diagram of a top view of a standard cell layout for a complex logic gate.

Referring to FIG. 2, a generalized block diagram of a top view of a standard cell layout 200 is shown. Layout elements described earlier are numbered identically. Similar to the layout 100, no active regions are shown for ease of illustration in the standard cell layout 200 for ease of illustration, and the pfets are at the top of the standard cell layout 200. The nfets are at the bottom of the standard cell layout 200. Here in layout 200, the gear ratio is two to one (2:1). For example, beginning from the left of the layout 200, the area for the fourth and fifth metal gate 110 tracks also includes the third, fourth and fifth Metal1 150 tracks as well as space for a sixth Metal1 150 track. Therefore, the gear ratio is four to two (4:2), or two to one (2:1). The Metal1 150 tracks for layout 200 are narrower (smaller width) and closer to one another (smaller pitch) than the Metal1 150 tracks for layout 100. In an embodiment, a more advanced version of an EUV technique is used to provide the resolution of each of the width and the pitch of the layout 200 compared to layout 100.

As shown, locations for the power connections are at the top of layout 200 and the ground connections are at the bottom of layout 200. The power and ground connections are not fixed at the chip level and can be moved inside the standard cell layout 200. In the illustrated embodiment, the power connections and ground connections share a Metal1 150 track in the occupied first and sixth Metal1 tracks from the left of layout 200. The input signals and the output signal for the complex gate are placed in the other occupied Metal1 150 tracks of layout 200 such as the second, third, fourth, fifth and seventh occupied Metal1 150 tracks of layout 200. As shown, each of the routes in any metal layer of the layout 200 uses unidirectional routes. Signal routes with no bends and no L-shapes are referred to as unidirectional routes. In contrast, signal routes with bends and/or L-shapes are referred to as bidirectional routes. Bidirectional routes create a significant on-die area penalty. Layouts 300-500 in upcoming FIGS. 3-5 also uses unidirectional routes in each metal layer.

In some embodiments, the layout 200 does not use the maximum length for the Metal1 150 tracks. Beginning from the left of the layout 200, in an embodiment, the second, third, fifth and seventh Metal1 150 tracks use a minimum length for the Metal1 150, rather than the maximum length. With the minimum length, or at least a length less than the maximum length, it is possible for a neighboring cell to route a signal in Metal1 150 into layout 200 and make a connection to the metal two layer with a via placed in layout 200 during chip level routing.

Figure 3:
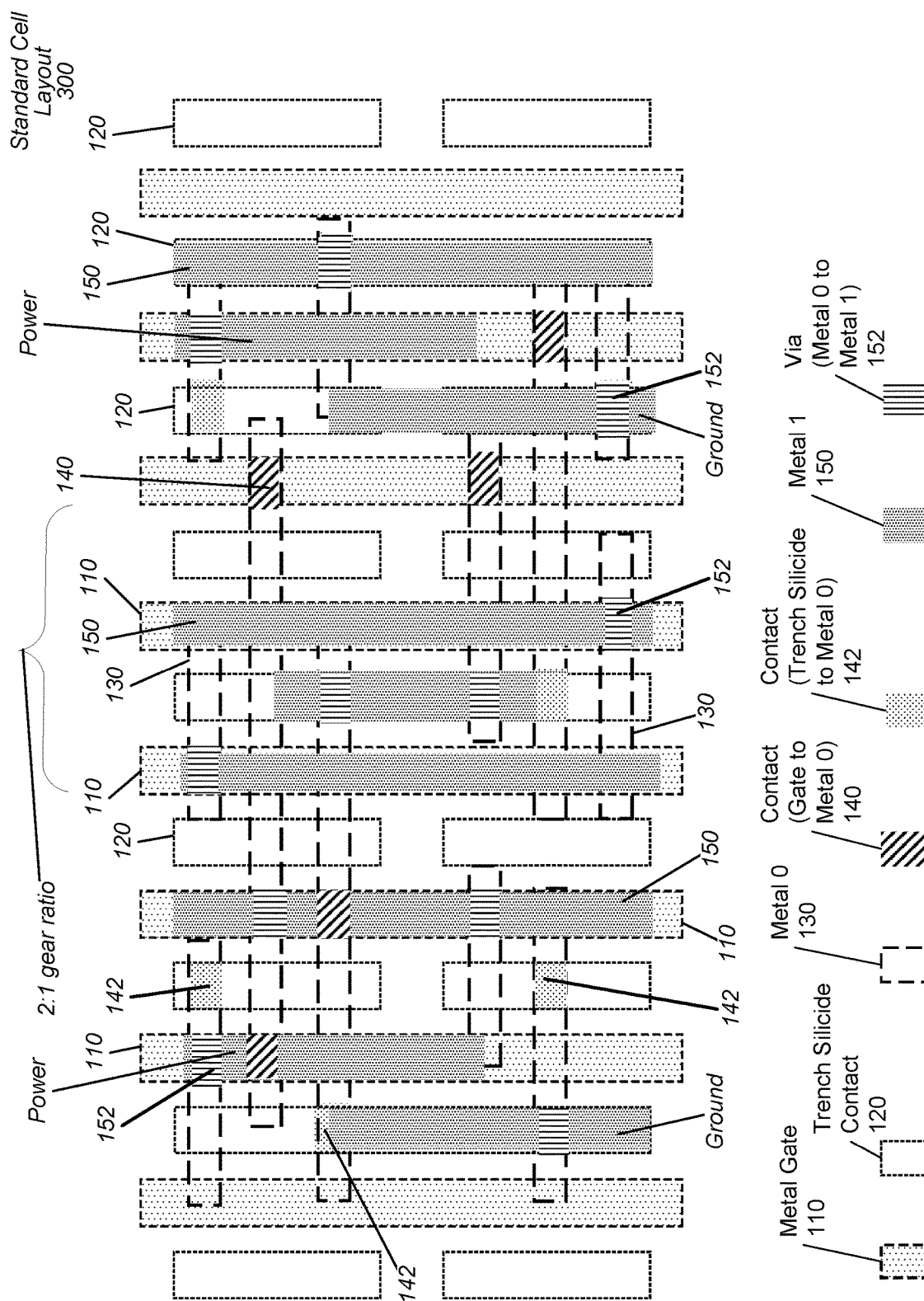
FIG. 3 is a generalized diagram of a top view of a standard cell layout for a complex logic gate.

Referring to FIG. 3, a generalized block diagram of a top view of a standard cell layout 300 is shown. Layout elements described earlier are numbered identically.

Similar to the layouts 100 and 200, no active regions are shown for ease of illustration in the standard cell layout 300 for ease of illustration. The pfets are at the top of the standard cell layout 300. The nfets are at the bottom of the standard cell layout 300. The layout 300 includes the same layers and placement of layers as layout 200, except the power and ground connections are moved. For example, the power connections in Metal1 150 are shifted to the right. Each of the Metal1 150 tracks for the power connections and the ground connections have their lengths increased. In some semiconductor fabrication processes, the processing yield reduces when the area of the Metal1 150 tracks for the power connections and the ground connections are below a threshold. For example, referring again to layout 200 (of FIG. 2), the lengths of the Metal1 150 tracks for the power connections and the ground connections (first and sixth Metal1 150 tracks from the left of layout 200) are too small to provide sufficient yield in some fabrication processes. If this is the case, then the layout 200 is modified to have one of the connections shifted and then both connections lengthened as shown in layout 300 (of FIG. 3).

The widths of the power and ground connections remain the same between the layout 200 and the layout 300, but the increased lengths increases the area of the power and ground connections. Although two Metal1 150 tracks are removed for signal routing in layout 300 due to the shifting of the power connections, there are still additional Metal1 150 tracks available in layout 300 for signal routing. The additional Metal1 150 tracks are available due to the higher gear ratio (2:1) of layout 300 as compared to the gear ratio (3:2) of layout 100.

Figure 4:
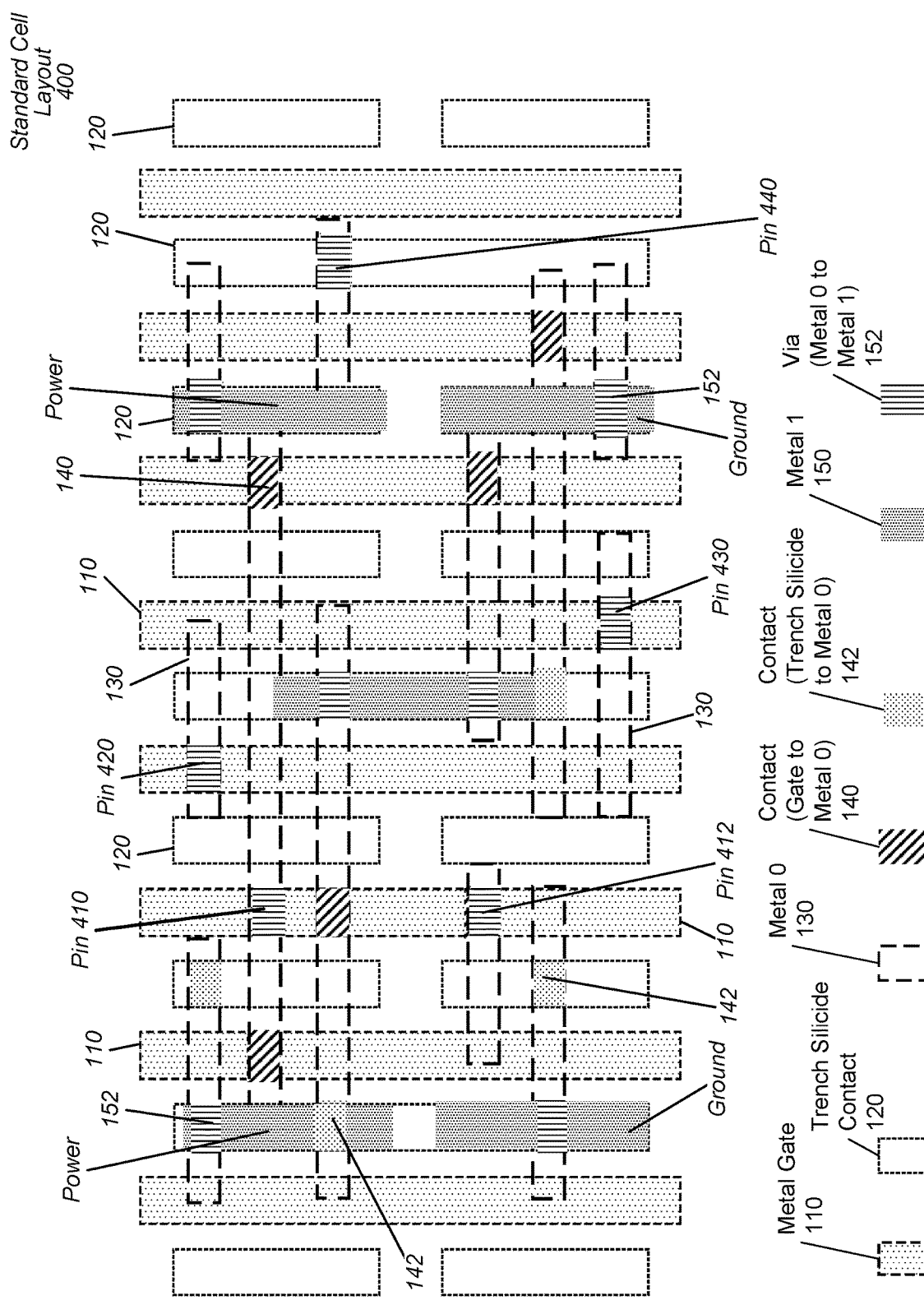
FIG. 4 is a generalized diagram of a top view of a standard cell layout for a complex logic gate.

Referring to FIG. 4, a generalized block diagram of a top view of a standard cell layout 400 is shown. Layout elements described earlier are numbered identically. Similar to the layouts 100-300, no active regions are shown for ease of illustration in the standard cell layout 400 for ease of illustration. The pfets are at the top of the standard cell layout 400. The nfets are at the bottom of the standard cell layout 400. The layout 400 includes the same layers and placement of layers as layout 200, except the layout 400 does not include one or more of the Metal1 150 tracks shown as occupied in the illustrated embodiment. In one embodiment, beginning from the left of layout 400, one or more of the second, third, fifth and seventh occupied Metal1 150 tracks are not placed in the layout 400. The signals using connections with via 152 in the third, fifth and seventh Metal1 150 tracks use a single via 152. In contrast, the signal using a connection with via 152 in the second Metal1 150 track uses two vias 152. When one or more of the signals are not included in the layout 400, the chip level place-and-route tool determines the placement and lengths of the missing Metal1 150 tracks when inserting them into the layout during chip level signal routing. In such an embodiment, the signals corresponding to these missing Metal1 150 layers in the layout 400 have net or pin properties used by a place-and-route tool to direct placement and routing of metal layers when routing signals.

When a particular Metal1 150 layer is not placed in the layout 400, a pin property is included in the netlist for the layout 400 that specifies a particular Metal1) 130 track corresponds to the signal of the non-placed Metal1 150 layer. For example, a designer adds a signal name or pin text on a corresponding metal layer or via to identify input signals, output signals and intermediate signals of interest. Examples of pin names are "IN," "OUT," and so on. A variety of signal names are possible and contemplated. For the signal using the second Metal1 150 track from the left of layout 400, two pin names are placed on the layout 400. These pins are generically labeled as pin 410 and pin 412 in the illustrated embodiment. In an embodiment, the pin names are placed on the vias 152. In another embodiment, the layout 400 does not also include the vias 152 for this signal, and the pin names are placed on the corresponding Metal1) 130 layers. When the pin name (pin property) is placed on the Metal1) 130 layer, the place-and-route tool has added flexibility to place and route a corresponding Metal1 150 layer for the signal using chip level routing information, rather than having either of the via 152 or the Metal1 150 layer already placed in the layout 400.

For the signal using the third Metal1 150 track from the left of layout 400, the pin 420 is placed to direct the place-and-route tool to complete signal routing using Metal1 150. In an embodiment, the pin name is placed on the via 152. In another embodiment, the layout 400 does not also include the via 152 for this signal, and the pin name is placed on the corresponding Metal1) 130 layer. In a similar manner, the pins 430 and 440 are placed in the layout 400.

Although the netlist also identifies active regions and devices (transistors) in addition to pins (signals), the place-and-route tool focuses on the pins. Using the pin property in the netlist of the layout 400, the place-and-route tool is aware that a Metal1 150 layer needs to connect to a particular Metal1) 130 layer when completing signal routing. In an embodiment, the via 152 is placed on the particular Metal1) 130 layer, so the pin property identifies the location for the via connection. The place-and-route tool still determines where to place the particular Metal1 150 layer for the signal and determines the length of the particular Metal1 150 layer.

Figure 5:
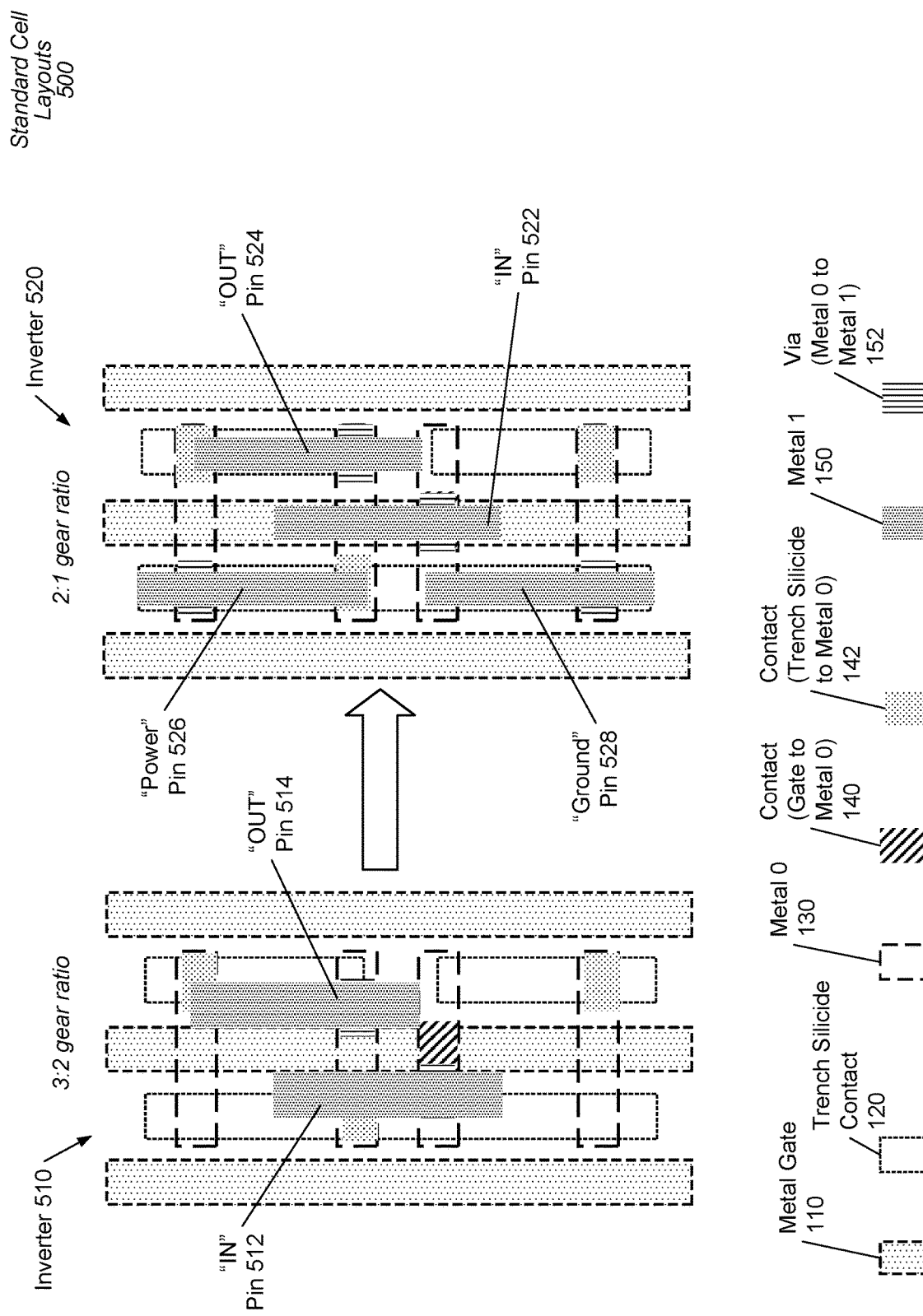
FIG. 5 is a generalized diagram of a top view of standard cell layouts for two logic gates.

Referring to FIG. 5, a generalized block diagram of a top view of two standard cell layouts 500 is shown. Layout elements described earlier are numbered identically. Similar to the layouts 100-400, no active regions are shown for ease of illustration in the standard cell layouts 500 for ease of illustration. The pfets are at the top and the nfets are at the bottom of inverters 510 and 520. In an embodiment, the standard cell layout for inverter 510 has a 3:2 gear ratio, whereas, the standard cell layout for inverter 520 has a 2:1 gear ratio. The input signals are labeled with pin 512 for inverter 510 and pin 522 for inverter 520. The output signals are labeled with pin 514 for inverter 510 and pin 524 for inverter 520.

Due to the 3:2 gear ratio of inverter 510, there are no available Metal1 150 tracks for power and ground connections. The standard cell layout for inverter 510 needs to be expanded, such as increasing the width, to include another Metal1 150 track to create area for power and ground connections. In contrast, the 2:1 ratio of inverter 520 provides sufficient area within the standard cell layout of inverter 520 to include power and ground connections without expanding the cell. As shown, inverter 520 includes the power connection with pin 526 and the ground connection with pin 528 in a same vertical Metal1 150 track.

Figure 6:
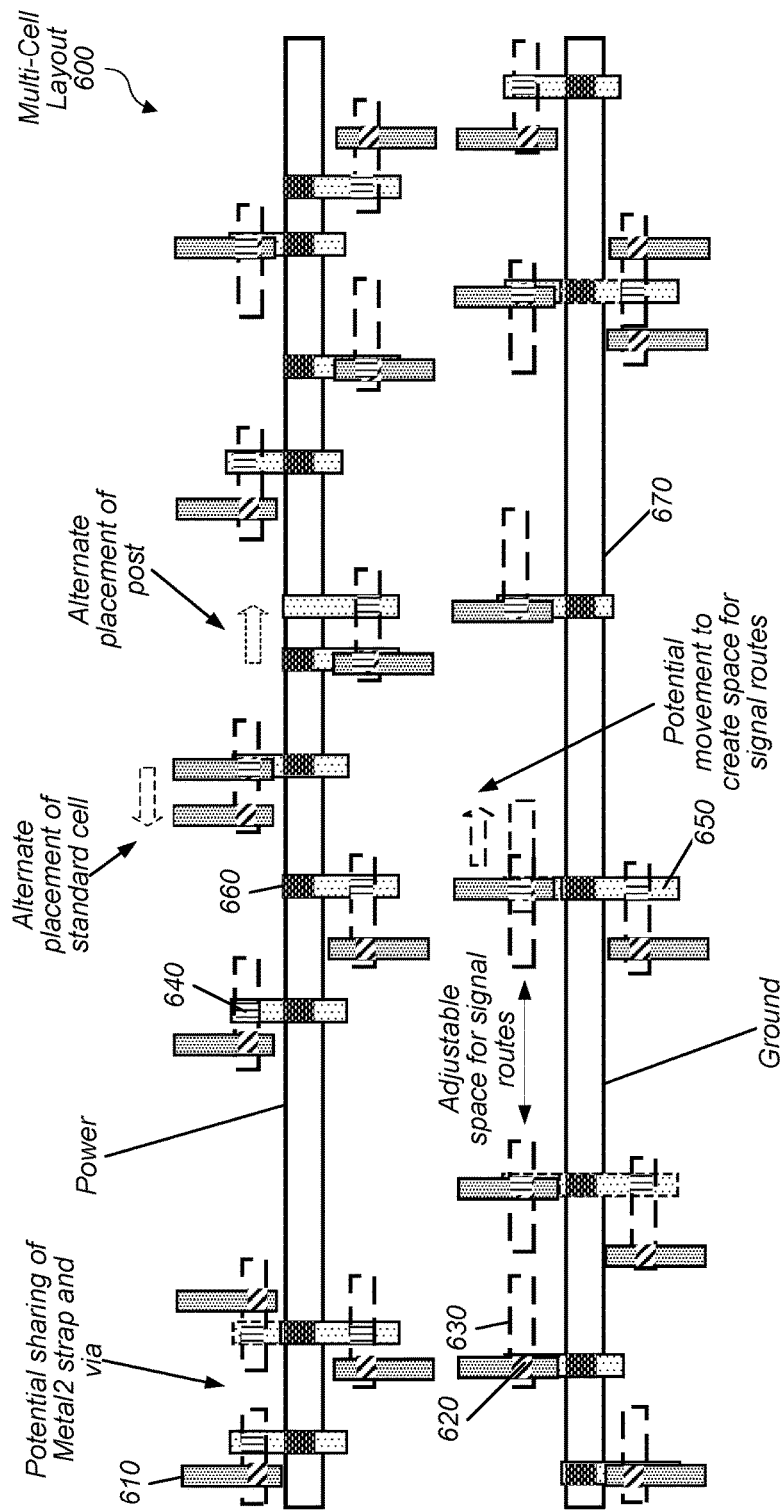
FIG. 6 is a generalized diagram of a top view of power grid connections for multi-cell layout.

Referring to FIG. 6, a generalized block diagram of a top view of a multi-cell layout 600 is shown. Multiple standard cells of varying type are used to create an array and the layout 600 is the layout of the resulting array. However, the array is not connected to a power grid using a particular pitch. For example, there is no power grid pitch used for determining where to place posts of any metal layer. Here, the active regions and metal gates are not shown in the multi-cell layout 600 for ease of illustration. In addition, the contacts between metal gates and horizontal metal zero layer are not shown as well as signal routes are not shown in the multi-cell layout 600 for ease of illustration. The vertical Metal1 610 layer being shown and elements below this layer (e.g., metal 0 layer, trench silicide contact, etc.) are part of a corresponding standard cell.

The multi-cell layout 600 uses metal 1 (M1 or Metal1) 610 for interconnections in the vertical direction, metal 2 (M2 or Metal2) 630 for interconnections in the horizontal direction, and vias 620 for connecting Metal1 610 to Metal2 630. In addition, the multi-cell layout 600 uses metal 3 (M3 or Metal3) 650 for interconnections in the vertical direction, and vias 640 for connecting Metal2 630 to Metal3 650. Further, the multi-cell layout 600 uses metal 4 (M4 or Metal4) 670 for interconnections in the horizontal direction, and vias 660 for connecting Metal3 650 to Metal4 670.

One route (top route) of the Metal4 670 layer is for a power connection and another route (bottom route) of the Metal4 670 layer is for a ground connection. The multi-cell layout 600 demonstrates one embodiment for connecting power and ground in an array. Connections to power and ground are routed from rails using Metal4 670 to vias 660 to posts using Metal3 650 to vias 640 to straps using Metal2 630 to vias 620 to posts using Metal1 610. The posts using Metal1 610 connect to trench silicide contacts within a corresponding standard cell through a metal zero layer and vias. Power and ground connections at the metal zero layer, which are not shown here, but rather, shown in FIGS. 2-5, are not shared. Therefore, the multi-cell layout 600 does not use power rails in the metal zero layer, which avoids electromigration (EM) issues.

The multi-cell layout 600 uses independent power posts in each of the vertical Metal1 610 and the vertical Metal3 650 in addition to independent power straps in the horizontal Metal2 630. A power post in a given metal layer is referred to as an independent power post when the power post is not connected to another of the multiple power posts of the given metal layer in a track of the given metal layer. Therefore, there are no power rails used in the given metal layer. No power rails are used in the metal zero layer, the Metal1 610 layer, the Metal2 630 layer and the Metal3 650 layer. As shown, each of the independent power posts in each of the vertical Metal1 610 layer and the vertical Metal3 650 layer in addition to each of the independent power straps in the horizontal Metal2 630 layer are routed with unidirectional routes. Signal routes with no bends and no L-shapes are referred to as unidirectional routes. In contrast, signal routes with bends and/or L-shapes are referred to as bidirectional routes. Bidirectional routes create a significant on-die area penalty.

The layout 600 does not use a fixed grid for the posts using vertical Metal3 650. There is no power grid pitch in the layout 600 used for determining where to place posts of any metal layer such as the vertical Metal3 650 layer. So the starting point for routing the straps using Metal2 630 is not a post on a fixed grid using Metal3 650. Rather, the starting point for routing the straps using Metal2 630 is the posts of the standard cells using Metal1 610. The place-and-route tool begins with the Metal1 610 post and routes the Metal2 630 strap until a minimum area requirement defined by design rules is met. The minimum area requirement is based on providing a processing yield above a threshold. For example, for a minimum width, the Metal2 630 strap, the place-and-route tool needs to route the strap a minimum length to satisfy the design rule. By maintaining the minimum area requirement for power and ground connections in layout 600, the place-and-route tool is able to provide more area for signal routes. As shown for a ground connection in layout 600, the place-and-route tool has the flexibility of moving the Metal2 630 strap to create space for later signal routing.

In a similar manner as the above routing of power and ground connections, the place-and-route tool begins routing a post in Metal3 650 at the Metal2 630 strap, and the place-and-route tool routes the Metal3 650 post until a minimum area requirement defined by design rules is met. The minimum area requirement for Metal3 650 is also based on providing a processing yield above a threshold. For example, for a minimum width, the Metal3 650 post, the place-and-route tool needs to route the post a minimum length (height in vertical direction) to satisfy the design rule. When the signal routes use a small amount of area for the Metal1 610 posts, Metal2 630 straps and Metal3 650 posts, the signal routes have less resistance and less electromigration effects. As shown in the layout 600, the place-and-route tool selects a location on the Metal1 610 post for starting the route of the Metal2 630 strap based on the minimum area requirement for the Metal3 650 post. The length (height in the vertical direction) for the Metal3 650 post is based on where the Metal2 630 strap connects to the Metal1 610 post.

It is also noted that the majority of the horizontal Metal2 630 straps are connected to a single Metal1 610 post and a single Metal3 650 post, rather than multiple posts of another metal layer. The reduced number of posts connected to the Metal2 630 straps also reduces the amount of current flowing through the Metal2 630 straps, which also reduces electromigration effects. Further, the reduced number of posts connected to the Metal2 630 straps also reduces voltage droop effects of the power supply voltage being supplied to the standard cells.

Although the routes in the Metal4 670 layer are shown as rails, in other embodiments, these routes are also independent straps, and rails are not used until a higher level metal layer such as a metal 5 layer, a metal 6 layer and so on. In such embodiments, the place-and-route tool also routes the straps in the Metal4 670 layer using a minimum area requirement for the Metal4 670 layer. In the illustrated embodiment, the width of the rails in Metal4 670 layer are wide due to the lengths of the rails and taking into consideration the electromigration effects. When independent straps are used in the Metal4 670 layer, the place-and-route tool is capable of using a minimum width for the routes in the Metal4 670 layer while also satisfying design rules.

The relatively short lengths of each of the Metal1 610, Metal2 630 and Metal3 650 for the power and ground connections allows these metal layers to handle higher currents than metal layers with relatively long lengths such as the lengths used in rails. The relatively short lengths of the Metal1 610, Metal2 630 and Metal3 650 also provides Blech length relief for these metal layers. Additionally, the relatively short vertical Metal3 650 posts consume less tracks than an approach using shared power rails.

Further, the relatively short lengths of each of the Metal1 610, Metal2 630 and Metal3 650 provide gaps for providing signal route tracks, which can alleviate or completely remove signal routing congestion. Therefore, the router of a place-and-route tool has increased flexibility when performing signal routing after the power and ground connections are completed with the relatively short metal lengths.

In addition, since the power and ground pins for the standard cells are inboard Metal1 610 posts, rather than using outboard rails, the place-and-route tool is able to move standard cells under the Metal2 630 layer and the Metal3 650 layer versus having a fixed location for the standard cells. As shown at the top of the layout 600, the place-and-route tool is capable of moving a Metal1 610 post by moving a standard cell to create an available Metal1 610 track for signal routing. In some embodiments, the length of the Metal2 630 post remains at a minimum length satisfying a minimum area requirement for the Metal2 630 layer. Similarly, as shown to the right of the possible standard cell movement, the place-and-route tool is capable of moving the Metal3 650 post to create an available Metal3 650 track for signal routing.

As shown in the top left corner of the layout 600, the place-and-route tool is capable of identifying locations where relief of signal congestion is possible. For example, the place-and-route tool has the flexibility of connecting the two separate Metal2 630 straps to create a single Metal2 630 strap and remove the left-most Metal3 650 post and via 660, which frees a track for routing in Metal3. A condition for the place-and-route tool to perform this change is that the resulting Metal2 630 strap does not exceed the Blech length for Metal 2. In an embodiment, when the top left corner of layout 600 does not have signal congestion, the place-and-route tool connects the two separate Metal2 630 straps to create a single Metal2 630 strap between the two Metal3 650 posts. A qualifying condition for performing this change is that the resulting Metal2 630 strap does not exceed the Blech length for Metal 2. By maintaining both Metal3 650 posts, the place-and-route tool increases via redundancy for the power connections in the top left corner of layout 600. Increasing via redundancy increases processing yield.

Figure 7:
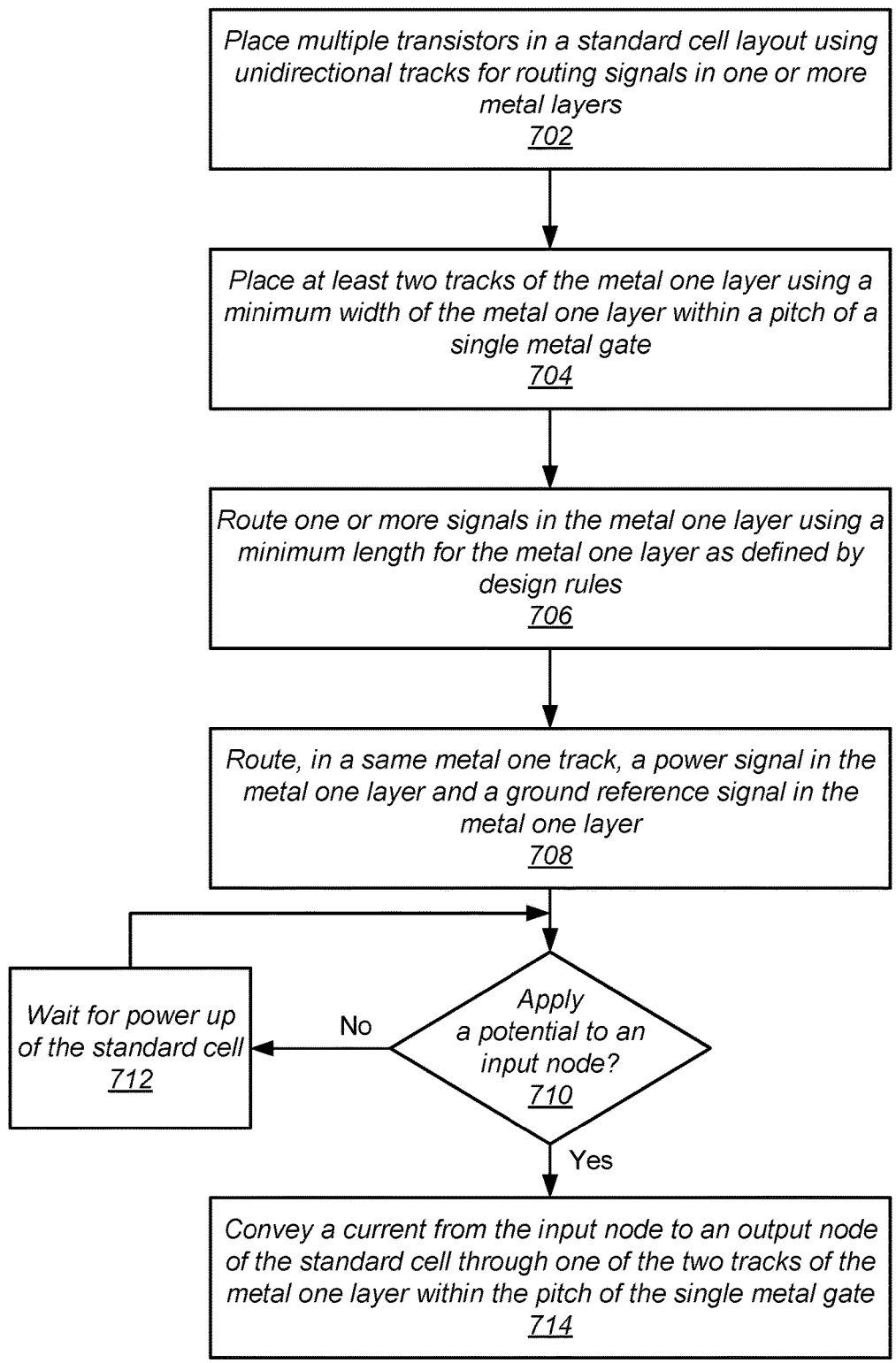
FIG. 7 is a generalized diagram of a method for creating layout for a standard cell.

Referring now to FIG. 7, one embodiment of a method 700 for creating layout for standard cells is shown. For purposes of discussion, the steps in this embodiment are shown in sequential order. However, in other embodiments some steps occur in a different order than shown, some steps are performed concurrently, some steps are combined with other steps, and some steps are absent.

One or more of a custom cell designer and an automated synthesis tool places multiple transistors in a standard cell layout using unidirectional tracks for routing signals in one or more metal layers (block 702). At least two tracks of the metal one layer using a minimum width of the metal one layer are placed within a pitch of a single metal gate (block 704). As described earlier, for the standard cell, a maximum ratio of a first number of tracks of a metal one layer that can fit in an area with a minimum width for the metal one layer to a second number of tracks of a metal gate layer that can fit in the area with a minimum width for the metal gate layer and still provide a processing yield above a threshold is referred to as the "gear ratio". Each of the first number and the second number is a positive, non-zero integer. In previous designs, the gear ratio was three to two or less such as one to one. However, with advanced development of lithography techniques, the gear ratio increases such as from three to two (3:2) to two to one (2:1) or greater.

One or more signals in the metal one layer are routed using a minimum length for the metal one layer as defined by design rules (block 706). The minimum length provides signal pins, such as input, output and intermediate signals, to a chip level place-and-route tool while still satisfying the minimum area requirements for the metal one layer. The minimum length reduces electromigration effects and provides area for signal routing for neighboring cells. A custom cell designer or an automated synthesis tool routes, in a same metal one track, a power signal in the metal one layer and a ground reference signal in the metal one layer (block 708). In some embodiments, each of the power signal and the ground reference signal uses a minimum length (or height in the vertical direction) defined by design rules for the metal one layer. Locating each of the power signal and the ground reference signal in a same track of the metal one layer provides area for signal routing for the standard cell and later for neighboring cells when chip level signal routing is performed.

When the standard cell exists either as a netlist for circuit simulation or as a physical, fabricated cell on a silicon chip die, the standard cell does not generate a signal on an output node until the one or more power connections receive a power supply voltage, the one or more ground reference connections receive a ground reference voltage, and the one or more input nodes receive a potential such as Boolean logic level. The Boolean logic level is one of a logic high level, such as the power supply voltage, or a logic low level such as the ground reference voltage. If a potential is not applied to an input node of the standard cell ("no" branch of the conditional block 710), then the standard cell waits for power up (block 712). However, if a potential is applied to the input node of the standard cell ("yes" branch of the conditional block 710), then the circuitry of the standard cell convey a current from the input node to the output node of the standard cell through one of the at least two tracks of the metal one layer within the pitch of the single metal gate (block 714).

Figure 8:
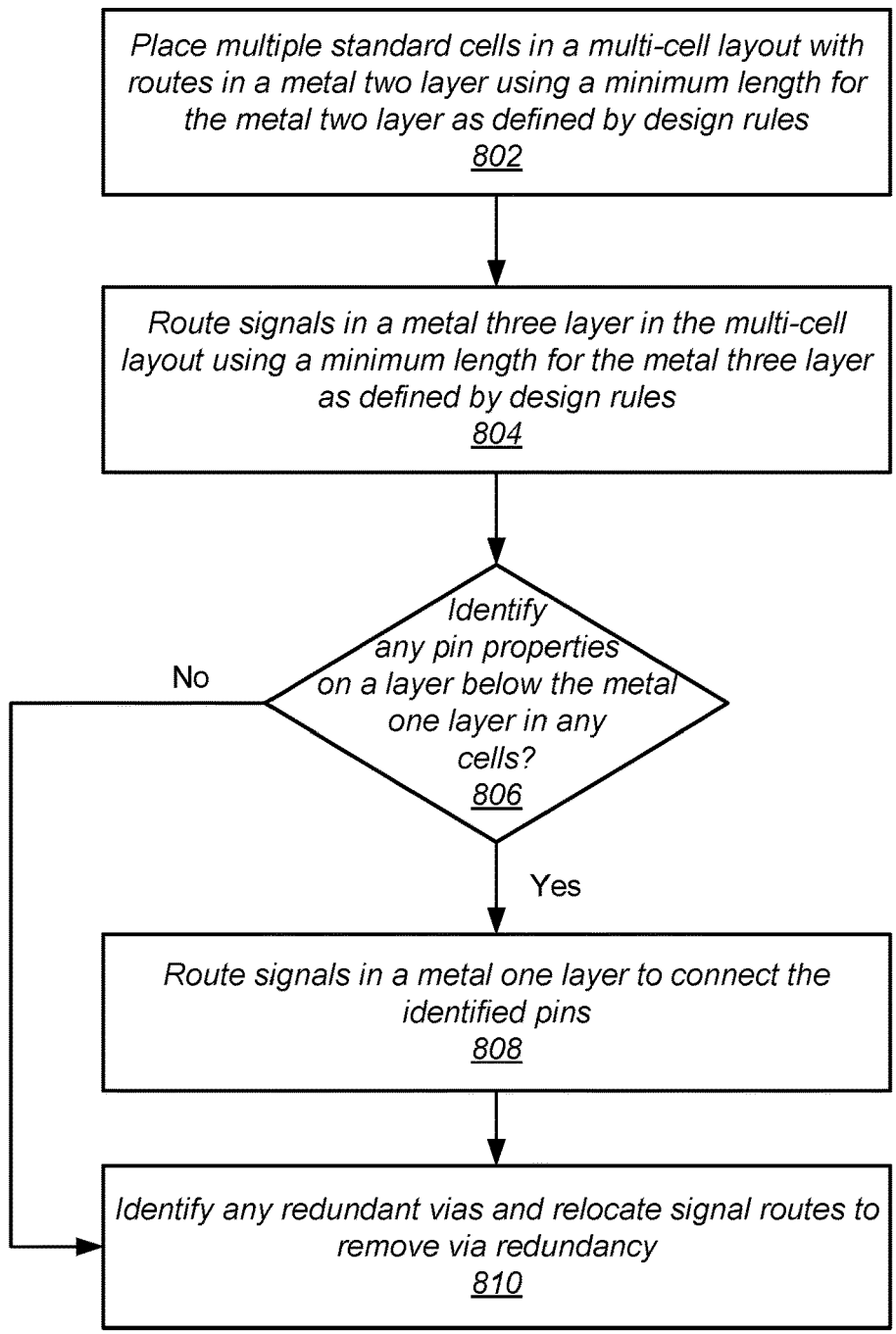
FIG. 8 is a generalized diagram of a method for laying out power grid connections for multiple standard cells.

Referring now to FIG. 8, one embodiment of a method 800 for creating layout for a chip is shown. One or more of a custom cell designer and an automated synthesis tool places multiple standard cells in a multi-cell layout with routes in a metal two layer using a minimum length for the metal two layer as defined by design rules (block 802). In various embodiments, the design rules are defined to provide parameters that for a particular semiconductor fabrication process provides a process yield above a threshold. Multiple standard cells of varying type are used to create an array at the chip level. However, the resulting array is not connected to a power grid using a particular pitch. For example, there is no power grid pitch used for determining where to place posts of any metal layer for creating power and ground reference connections. In some embodiments, signals are also routed in a metal three layer in the multi-cell layout using a minimum length for the metal three layer as defined by design rules (block 804).

In various embodiments, an automated place-and-route tool identifies whether there are any pin properties on a layer below the metal one layer in any standard cells. In some embodiments, designers remove one or more signal pins in the metal one layer from a standard cell. The associated pin property, which is typically placed on the metal one layer signal route, is now placed on a corresponding via or metal zero layer signal route. The resulting netlist of the standard cell includes the pin property and association with a layer below the metal one layer for the signal. If the place-and-route tool identifies a pin property on a layer below the metal one layer in a standard cell ("yes" branch of the conditional block 806), then the tool routes signals in a metal one layer to connect the identified pins (block 808). If the place-and-route tool does not identify a pin property on a layer below the metal one layer in a standard cell ("no" branch of the conditional block 806), then control flow of method 800 moves to block 810. At block 810, the place-and-route tool identifies any redundant vias and relocate signal routes to remove via redundancy. Reducing the number of vias increases the processing yield for the chip.

It is noted that one or more of the above-described embodiments include software. In such embodiments, the program instructions that implement the methods and/or mechanisms are conveyed or stored on a computer readable medium. Numerous types of media which are configured to store program instructions are available and include hard disks, floppy disks, CD-ROM, DVD, flash memory, Programmable ROMs (PROM), random access memory (RAM), and various other forms of volatile or non-volatile storage. Generally speaking, a computer accessible storage medium includes any storage media accessible by a computer during use to provide instructions and/or data to the computer. For example, a computer accessible storage medium includes storage media such as magnetic or optical media, e.g., disk (fixed or removable), tape, CD-ROM, or DVD-ROM, CD-R, CD-RW, DVD-R, DVD-RW, or Blu-Ray. Storage media further includes volatile or non-volatile memory media such as RAM (e.g. synchronous dynamic RAM (SDRAM), double data rate (DDR, DDR2, DDR3, etc.) SDRAM, low-power DDR (LPDDR2, etc.) SDRAM, Rambus DRAM (RDRAM), static RAM (SRAM), etc.), ROM, Flash memory, non-volatile memory (e.g. Flash memory) accessible via a peripheral interface such as the Universal Serial Bus (USB) interface, etc. Storage media includes microelectromechanical systems (MEMS), as well as storage media accessible via a communication medium such as a network and/or a wireless link.

Additionally, in various embodiments, program instructions include behavioral-level descriptions or register-transfer level (RTL) descriptions of the hardware functionality in a high level programming language such as C, or a design language (HDL) such as Verilog, VHDL, or database format such as GDS II stream format (GDSII). In some cases the description is read by a synthesis tool, which synthesizes the description to produce a netlist including a list of gates from a synthesis library. The netlist includes a set of gates, which also represent the functionality of the hardware including the system. The netlist is then placed and routed to produce a data set describing geometric shapes to be applied to masks. The masks are then used in various semiconductor fabrication steps to produce a semiconductor circuit or circuits corresponding to the system. Alternatively, the instructions on the computer accessible storage medium are the netlist (with or without the synthesis library) or the data set, as desired. Additionally, the instructions are utilized for purposes of emulation by a hardware based type emulator from such vendors as Cadence®, EVE®, and Mentor Graphics®.

Although the embodiments above have been described in considerable detail, numerous variations and modifications will become apparent to those skilled in the art once the above disclosure is fully appreciated. It is intended that the following claims be interpreted to embrace all such variations and modifications.

What is claimed is:

1. A standard cell layout comprising:
    a plurality of transistors comprising at least a first transistor and a second transistor;
    a plurality of unidirectional signal routes in each of a metal zero layer and a metal one layer; and
    wherein one or more of the first transistor and the second transistor includes at least two tracks of the metal one layer using a minimum width of the metal one layer within a pitch of a single metal gate; and
    wherein responsive to a potential being applied to an input node of the standard cell layout, a current is conveyed from the input node to an output node of the standard cell layout through one of the two tracks of the metal one layer within the pitch of the single metal gate.

2. The standard cell layout as recited in claim 1, wherein one or more routes using the metal one layer has a minimum length for the metal one layer as defined by design rules.

3. The standard cell layout as recited in claim 1, further comprising a power route in the metal one layer and a ground reference route in the metal one layer in a same metal one track as the power route.

4. The standard cell layout as recited in claim 3, wherein each of the power route and the ground reference route uses a minimum length for the metal one layer as defined by design rules.

5. The standard cell layout as recited in claim 3, wherein each of the power route and the ground reference route is connected to a respective single route in the metal one layer, and each respective single route comprises a single other via other than a via for connecting to either the power route or the ground reference route.

6. The standard cell layout as recited in claim 1, further comprising a via for connecting a route in the metal zero layer to a route in the metal one layer, wherein:
    the route in the metal one layer is absent; and
    the via has a pin property in a corresponding netlist indicating to a place-and-route tool to add the route in the metal one layer.

7. The standard cell layout as recited in claim 1, wherein the standard cell layout is placed in a multi-cell layout comprising a plurality of routes in a metal two layer using a minimum length for the metal two layer as defined by design rules.

8. The standard cell layout as recited in claim 1, wherein the standard cell layout is placed in a multi-cell layout comprising a plurality of routes in a metal three layer using a minimum length for the metal three layer as defined by design rules.

9. The standard cell layout as recited in claim 1, wherein the standard cell layout is placed in a multi-cell layout comprising a route in the metal one layer added by a place-and-route tool based on a pin property in a corresponding netlist indicating to the place-and-route tool to add the route in the metal one layer to the standard cell layout.

10. A method comprising:
    placing, in a standard cell layout, a plurality of transistors comprising at least a first transistor and a second transistor;
    routing, in the standard cell layout, a plurality of unidirectional signal routes in each of a metal zero layer and a metal one layer;
    placing, for one or more of the first transistor and the second transistor, at least two tracks of the metal one layer using a minimum width of the metal one layer within a pitch of a single metal gate; and
    responsive to a power supply voltage being applied to an input node of the standard cell layout, conveying a current from the input node to an output node of the standard cell layout through one of the two tracks of the metal one layer within the pitch of the single metal gate.

11. The method as recited in claim 10, wherein one or more routes using the metal one layer has a minimum length for the metal one layer as defined by design rules.

12. The method as recited in claim 10, further comprising placing a power route in the metal one layer and a ground reference route in the metal one layer in a same metal one track as the power route.

13. The method as recited in claim 12, wherein each of the power route and the ground reference route uses a minimum length for the metal one layer as defined by design rules.

14. The method as recited in claim 12, wherein each of the power route and the ground reference route is connected to a respective single route in the metal one layer, and each respective single route comprises a single other via other than a via for connecting to either the power route or the ground reference route.

15. The method as recited in claim 10, further comprising placing the standard cell in a multi-cell layout comprising a plurality of routes in a metal two layer using a minimum length for the metal two layer as defined by design rules.

16. A non-transitory computer readable storage medium storing a plurality of instructions which, when executed, generate an integrated circuit layout for a standard cell that comprises:

a plurality of transistors comprising at least a first transistor and a second transistor;

a plurality of unidirectional signal routes in each of a metal zero layer and a metal one layer; and wherein one or more of the first transistor and the second transistor includes at least two tracks of the metal one layer using a minimum width of the metal one layer within a pitch of a single metal gate; and wherein responsive to a power supply voltage being applied to an input node of the standard cell layout, a current is conveyed from the input node to an output node of the standard cell layout through one of the two tracks of the metal one layer within the pitch of the single metal gate.

17. The non-transitory computer readable storage medium as recited in claim 16, wherein one or more routes using the metal one layer has a minimum length for the metal one layer as defined by design rules.

18. The non-transitory computer readable storage medium as recited in claim 15, wherein the standard cell further comprises a power route in the metal one layer and a ground reference route in the metal one layer in a same metal one track as the power route.

19. The non-transitory computer readable storage medium as recited in claim 18, wherein each of the power route and the ground reference route uses a minimum length for the metal one layer as defined by design rules.

20. The non-transitory computer readable storage medium as recited in claim 18, wherein each of the power route and the ground reference route is connected to a respective single route in the metal one layer, and each respective single route comprises a single other via other than a via for connecting to either the power route or the ground reference route.

* * * * *